(12) United States Patent
Hansson

(10) Patent No.: US 6,316,361 B1
(45) Date of Patent: Nov. 13, 2001

(54) CVD REACTOR AND PROCESS FOR PRODUCING AN EPITALLY COATED SEMICONDUCTOR WAFER

(75) Inventor: Per-Ove Hansson, Aspen Heights (SG)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/398,357

(22) Filed: Sep. 17, 1999

(30) Foreign Application Priority Data

Oct. 13, 1998 (DE) .............................. 198 47 101

(51) Int. Cl.⁷ .................................. H01L 21/44
(52) U.S. Cl. ............... 438/680; 117/88; 118/719
(58) Field of Search ................... 438/680, 697, 438/16, 22; 117/88; 118/725, 719

(56) References Cited

U.S. PATENT DOCUMENTS 5,891,251 * 4/1999 MacLish et al. .................. 118/719
6,019,839 * 2/2000 Achuthareman et al. ............. 117/88

FOREIGN PATENT DOCUMENTS

07/14998 11/1995 (EP) .

OTHER PUBLICATIONS

Epitaxial Silicon Technology, Ed. Jayant Biological Academic Press Inc. Orlando, Florida; 1986.

* cited by examiner

Primary Examiner—David Nelms
Assistant Examiner—Dung A Le
(74) Attorney, Agent, or Firm—Collard & Roe, P.C.

(57) ABSTRACT

A CVD reactor has an upper reactor chamber (2), a lower reactor chamber (3) and a dividing wall (4) that has a circular hole (5) in which a holding ring (6) for a wafer (7) is positioned. A process for producing an epitaxially coated semiconductor wafer includes the following:

a) placing a semiconductor wafer in a CVD reactor having an upper reactor chamber (2), a lower reactor chamber (3) and a dividing wall (4) that has a circular hole (5) in which a holding ring (6) for a wafer is positioned, b) heating the semiconductor wafer using heat sources, c) depositing a protective layer on the back of the semiconductor wafer, d) depositing an epitaxial layer on the front of the semiconductor wafer, and e) removing the epitaxially coated semiconductor wafer from the CVD reactor.

2 Claims, 2 Drawing Sheets

Prior art

DSE process flowchart

US 6,316,361 B1

CVD REACTOR AND PROCESS FOR PRODUCING AN EPITALLY COATED SEMICONDUCTOR WAFER

BACKGROUND OF THE INVENTION

1. Field of the Invention

The present invention relates to a CVD reactor and to a process for producing an epitaxially coated semiconductor wafer.

2. The Prior Art

Crystal growth from vapor is employed in semiconductor technology, in particular, for producing epitaxially coated semiconductor wafers. The term epitaxy describes the growth of a monocrystalline layer on the planar boundary surface of a monocrystalline substrate, generally a substrate wafer, for example a semiconductor wafer.

This coating or deposition is carried out using so-called chemical vapor deposition (CVD) in CVD reactors, as for example described in EP 0,714,998 A2. The semiconductor wafer is in this case firstly heated using heat sources and then exposed to a gas mixture, referred to below as the process gas, consisting of a source gas, a carrier gas and, where appropriate, a dopant gas. Trichlorosilane is for example used as the source gas, and hydrogen, for example, is used as the carrier gas. The dopant gases for doping the epitaxial layer are gaseous compounds, for example from Group III or VI of the periodic table. These compounds, for example phosphine or diborane decompose, as the source gas does, in proximity to the heated wafer. The foreign atoms are then included or incorporated in the crystal lattice of the epitaxial layer. As a rule, the semiconductor wafer (substrate wafer) and the epitaxial layer are doped differently in order to obtain a sharp change in the electrical properties, for example a steep rise in the resistance profile on transition from the substrate wafer to the epitaxial layer.

When producing an epitaxial layer, it is necessary to suppress so-called autodoping. The term autodoping describes the undesired contamination of the process gas with the substrate dopant (dopant of the semiconductor wafer). At elevated temperature, the substrate dopant is capable, because of thermal motion, of migrating in the host crystal lattice. This migratory movement is also referred to as diffusion. When an epitaxial layer is being deposited on the front of the semiconductor wafer, the substrate dopant can diffuse out through the back of the semiconductor wafer. This gaseous compound mixes with the process gas and becomes deposited in a CVD process, so that the dopant of the semiconductor wafer finally ends up in the epitaxial layer.

At this point the front and back of a semiconductor wafer ought to be defined. Before an epitaxial layer is deposited on one side of a semiconductor wafer, the wafer undergoes chemical and/or mechanical surface treatments, for example lapping, polishing and etching treatments. The front of the semiconductor wafer, on which at least one epitaxial layer is deposited, is given a very shiny polish, while the back is coated, for example, with polycrystalline silicon and/or silicon dioxide. The polysilicon layers are used, for example, as extrinsic getters, and the oxide layers, for example, as a protective layer.

According to the prior art, various processes have been disclosed which counteract autodoping. By depositing, for example, an oxide or monocrystalline or polycrystalline or amorphous protective layer on the back of the semiconductor wafer, substrate dopant can be prevented from diffusing out during the epitaxy.

As a rule, use is made of an oxide layer which is deposited in an LTO process (low-temperature oxide process) upstream of the epitaxy. Because of their relatively low process temperatures, LTO processes are time-consuming and expensive. After this back coating, however, the LTO (low-temperature oxide) is also found on the wafer edges and, to some extent, on the front of the wafer as well, which impairs polishing and epitaxy processes. It is therefore necessary, in a subsequent process step, to remove the LTO from the edges and the front by wet chemical means, preferably by etching. However, the growth of a perfect epitaxial layer requires a planar boundary surface, so that the front needs to be polished after the wet chemical treatment.

It is known to the person skilled in the art that an oxide protective layer can also be obtained by exposing the semiconductor wafer to gases with oxidizing action, for example oxygen or ozone at elevated temperatures.

A disadvantage with all known processes for producing an epitaxially coated semiconductor wafer having a protective layer to suppress autodoping is the additional process steps which need to be carried out in different reactors, treatment baths and polishing lines.

SUMMARY OF THE INVENTION

It is an object of the present invention to reduce the process steps for producing an epitaxially coated semiconductor wafer, which will simplify the production process.

This object is achieved according to the invention by a CVD reactor for producing an epitaxially coated semiconductor wafer, having an upper reactor chamber, a lower reactor chamber and a dividing wall that has a circular hole in which a holding ring for a wafer is positioned.

This object is also achieved according to the invention by a process for producing an epitaxially coated semiconductor wafer, which has the following process steps:

a) placing a semiconductor wafer in a CVD reactor having an upper reactor chamber, a lower reactor chamber and a dividing wall that has a circular hole in which a holding ring for a wafer is positioned;

b) heating the semiconductor wafer using heat sources;

c) depositing a protective layer on the back of the semiconductor wafer;

d) depositing an epitaxial layer on the front of the semiconductor wafer; and e) removing the epitaxially coated semiconductor wafer from the CVD reactor.

The CVD reactor according to the invention has two independent reactor chambers, with the front of the semiconductor wafer being located in the upper reactor chamber and with the back of the semiconductor wafer being located in the lower reactor chamber.

An advantage of the invention is that the substrate dopant diffusing out, in particular, from the back of the semiconductor wafer cannot contaminate the process gas flowing past the front of the wafer. Another advantage is that epitaxial layers and/or protective layers can be deposited independently, simultaneously or in succession on both sides of a semiconductor wafer using only a single CVD reactor. Examples of preferred protective layers include $Si_xN_yH_z$ and $SiO_xN_yH_z$. Si is a particularly preferred protective layer, with the layers being monocrystalline or polycrystalline or amorphous. If more than one protective layer is deposited, layer sequences of polycrystalline Si and/or monocrystalline Si are preferred.

Before a coating operation, it is desirable to clean the two reactor chambers and the surfaces of the semiconductor wafer. In this case, the reactor chambers are preferably first flushed with an inert gas, for example nitrogen. Next, the surfaces of the chambers are treated with an etching gas, for example hydrogen chloride, this being followed by flushing the reactor chambers again with an inert gas. It is, however, possible for the reactor chambers to undergo this type of cleaning individually or together in the absence of a semiconductor wafer, especially if the cleaning conditions might damage the semiconductor wafer. In the case of cleaning a single chamber, a suitable disk-shaped aid should be positioned in the CVD reactor.

After the cleaning, one side, preferably the back, of the semiconductor wafer is coated first. Using the CVD reactor according to the invention, any layer customary in semiconductor technology, in particular any protective layer, for example a polysilicon layer, can be deposited on the back of the semiconductor wafer by a CVD process. While the back of the semiconductor wafer is being coated in the lower reactor chamber, the upper process chamber may be flushed with an inert gas. A pressure difference between the reactor chambers is also found to be desirable. Preferably, there is a higher gas pressure in the upper reactor chamber while coating is being carried out in the lower reactor chamber.

Next, at least one epitaxial layer is deposited on the front of the semiconductor wafer. The process gases used in semiconductor technology to deposit an epitaxial layer are well known. Nitrogen, argon or hydrogen are preferably used as flushing gases. Hydrogen is preferably used as the carrier gas for the source gas, for example trichlorosilane. While at least one epitaxial layer is being deposited on the front of the semiconductor wafer in the upper reactor chamber, the lower reactor chamber is flushed with inert flushing gas.

Another preferred process embodiment for producing an epitaxially coated semiconductor wafer is one which has the following process steps:

a) placing a semiconductor wafer in a CVD reactor having an upper reactor chamber, a lower reactor chamber and a dividing wall that has a circular hole in which a holding ring for a wafer is positioned;

b) heating the semiconductor wafer using heat sources;

c) depositing a protective layer on the back of the semiconductor wafer, and simultaneously depositing an epitaxial layer on the front of the wafer; and, d) removing the epitaxially coated semiconductor wafer from the CVD reactor.

After the cleaning, the back and front of the semiconductor wafer may also be coated at the same time, in particular by depositing at least one epitaxial layer on the front of the semiconductor wafer and depositing at least one protective layer on its back.

It is particularly preferable to deposit at least one epitaxial layer both on the front of the semiconductor wafer in the upper reactor chamber and on the back of the wafer in the lower reactor chamber. This is done by successively or simultaneously feeding various process gases into the two reactor chambers in a particular sequence of process steps. The nature of the deposition, dopant, carrier and flushing gases used and the deposition procedure, that is to say the duration of the treatment, the sequence of process steps, as well as the temperature conditions during the treatment and the deposition rates are known to the person skilled in the art. See for example the publication *"Epitaxial Silicon Technology,* Ed. Jayant Baliga, Academic Press Inc. Orlando, Fla.; 1986".

The semiconductor wafer is firstly heated, and then kept at a specific temperature preferably between 600° C. and 1200° C., during all the coating and deposition processes using upper and lower heat sources, for example lamps or banks of lamps.

BRIEF DESCRIPTION OF THE DRAWINGS

Other objects and features of the present invention will become apparent from the following detailed description considered in connection with the accompanying drawings which discloses several embodiments of the present invention. It should be understood, however, that the drawings are designed for the purpose of illustration only and not as a definition of the limits of the invention.

In the drawings, wherein similar reference characters denote similar elements throughout the several views.

All the devices, for example gas distribution devices or devices for uniform heat treatment of the wafer, which, according to the prior art, reactors of the aforementioned generic type have, are not represented.

DETAILED DESCRIPTION OF PREFERRED EMBODIMENTS

Figure 2:
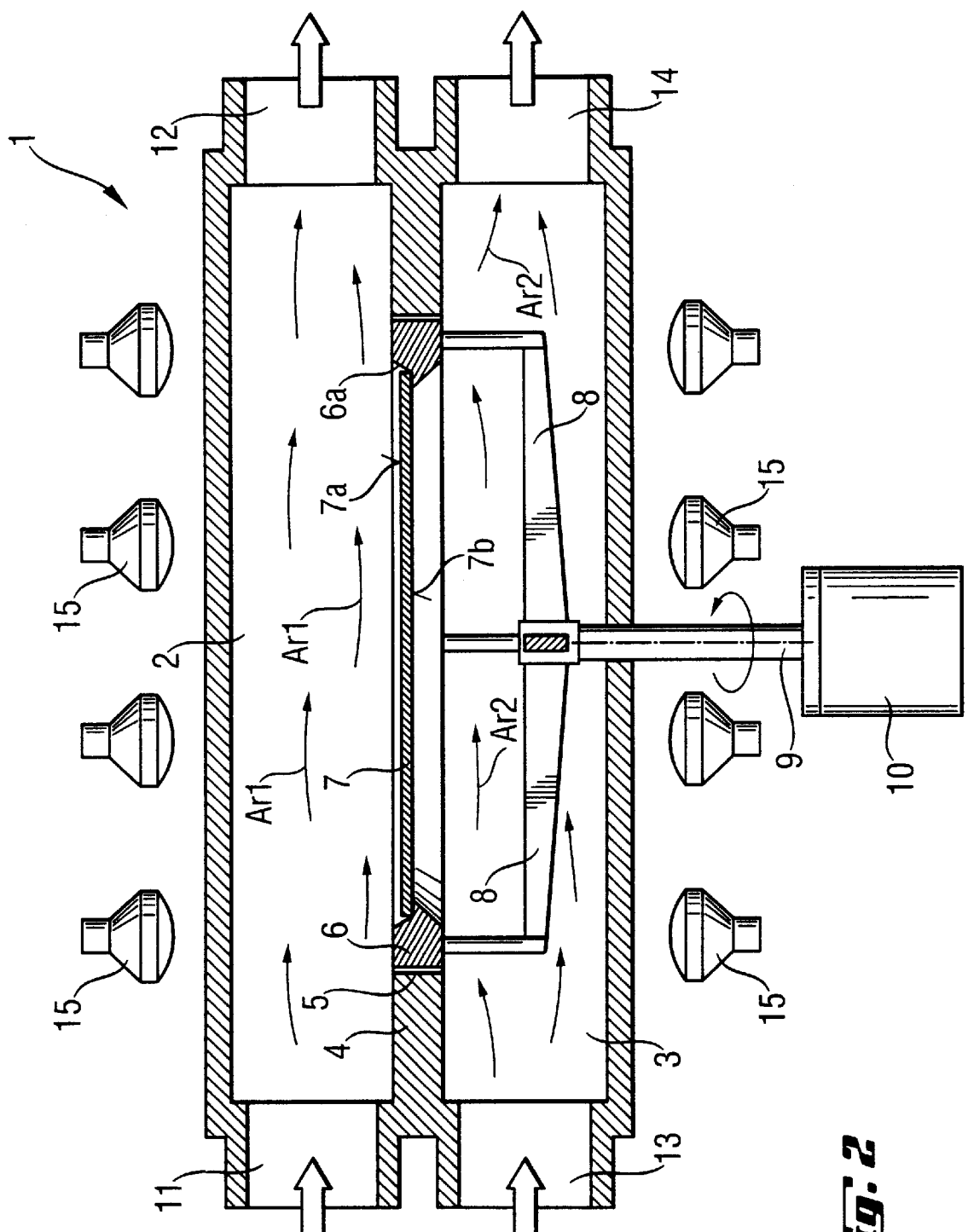
FIG. 2 schematically shows a cross section of an embodiment of a CVD reactor according to the invention.

Turning now in detail to the drawings, the CVD reactor 1 according to the invention has an upper reactor chamber 2 and a lower reactor chamber 3 as shown in FIG. 2. The dividing wall 4 between the reactor chambers 2 and 3 has a circular hole 5, in which a holding ring 6 for a semiconductor wafer 7 is positioned with a small clearance. The holding ring 6 is preferably connected by spokes 8 to a shaft 9 which can be rotated using a drive 10. Both the upper reactor chamber 2 and the lower reactor chamber 3 are provided with a gas feed line 11 and 13, respectively, and a gas discharge line 12 and 14, respectively, in such a way that the gas can flow past the front 7a of the semiconductor wafer or the back 7b of the semiconductor wafer in the direction of the arrows Ar1 and Ar2 respectively. The CVD reactor 1 has a plurality of heat sources 15, for example lamps, for heating, in particular, the semiconductor wafer. The holding ring 6 preferably has a corresponding indentation 6a for positioning the semiconductor wafer 7. The semiconductor wafer 7 can be positioned in the indentation 6a using a manipulator (not shown).

The front 7a and the back 7b of the semiconductor wafer can be exposed independently of one another to flows of gases, for example process, flushing or etching gases, since the upper and lower reactor chambers are separated from one another by the semiconductor wafer 7.

Figure 1A:
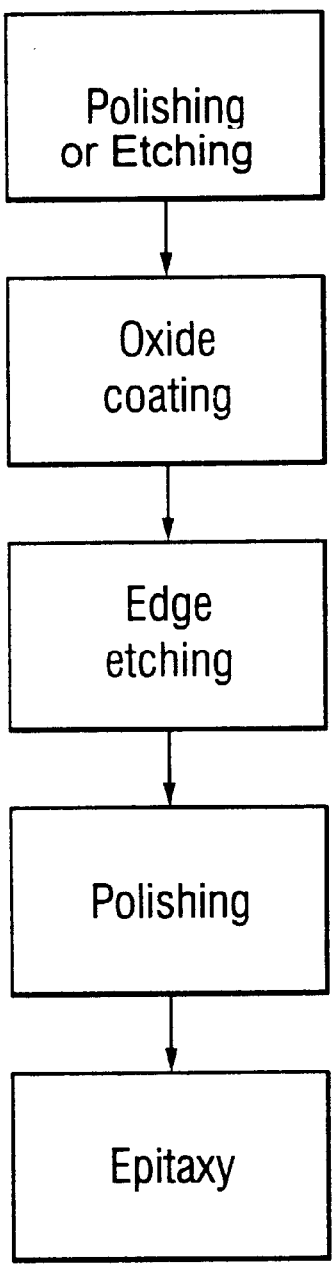
FIG. 1a shows a general flowchart for producing an epitaxially coated semiconductor wafer according to the prior art (left)
Figure 1B:
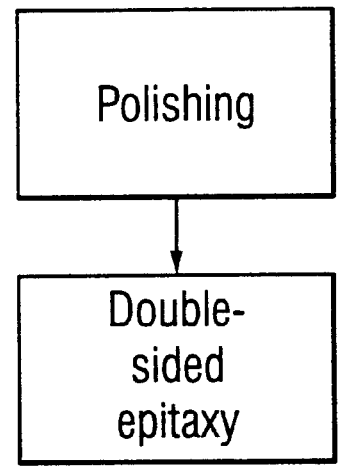
FIG. 1b show a general flowchart for producing an epitaxially coated semiconductor wafer according to the present invention (right)

FIG. 1a and FIG. 1b show in a side-by-side flow chart comparison, how the process of the present invention can reduce the total number of process steps and yet produce a double sided epitaxy of the semiconductor wafer.

Accordingly, while a few embodiments of the present invention have been shown and described, it is to be understood that many changes and modifications may be made thereunto without departing from the spirit and scope of the invention as defined in the appended claims.

What is claimed is:

1. A process for producing an epitaxially coated semiconductor wafer, comprising the process steps:

a) placing a semiconductor wafer (7) in a CVD reactor (1) having an upper reactor chamber (2), a lower reactor chamber (3) and a dividing wall (4) between said upper chamber and said lower chamber and said wall (4) having a circular hole (5) in which a holding ring (6) for the wafer (7) is positioned; said wafer (7) having a front side (7a) and a back side (7b);

wherein the front side (7a) of the wafer is located in the upper reactor chamber (2) and the back side (7b) of the wafer is located in the lower reactor chamber (3);

b) heating the semiconductor wafer using heat sources (15);

c) depositing a protective layer on the back side (7b) of the semiconductor wafer;

d) depositing an epitaxial layer on the front side (7a) of the semiconductor wafer; and e) removing the epitaxially coated semiconductor wafer from the CVD reactor.

2. A process for producing an epitaxially coated semiconductor wafer, comprising the process steps:

a) placing a semiconductor wafer (7) in a CVD reactor (1) having an upper reactor chamber (2), a lower reactor chamber (3) and a dividing wall (4) between said upper chamber and said lower chamber and said wall (4) having a circular hole (5) in which a holding ring (6) for the wafer (7) is positioned; said wafer (7) having a back side (7b) and a front side (7a);

wherein the front side (7a) of the wafer is located in the upper reactor chamber (2) and the back side (7b) of the wafer is located in the lower reactor chamber (3);

b) heating the semiconductor wafer using heat sources (15);

c) depositing a protective layer on the back side (7b) of the semiconductor wafer, and simultaneously depositing an epitaxial layer on the front side (7a); and d) removing the epitaxially coated semiconductor wafer from the CVD reactor.

\* \* \* \* \*